United States Patent [19]

Smith

[11] 4,189,826
[45] Feb. 26, 1980

[54] SILICON CHARGE-HANDLING DEVICE EMPLOYING SIC ELECTRODES

[75] Inventor: Frank T. J. Smith, Rochester, N.Y.

[73] Assignee: Eastman Kodak Company, Rochester, N.Y.

[21] Appl. No.: 972,618

[22] Filed: Dec. 22, 1978

Related U.S. Application Data

[62] Division of Ser. No. 775,147, Mar. 7, 1977.

[51] Int. Cl.² .................................................. B01J 17/00
[52] U.S. Cl. ........................................ 29/590; 357/24; 357/59
[58] Field of Search ..................... 29/578, 589, 590; 357/24, 59

[56] References Cited

U.S. PATENT DOCUMENTS

| | | | |
|---|---|---|---|
| 3,497,773 | 2/1970 | Kisinko | 357/51 |
| 3,622,382 | 11/1971 | Brack | 357/48 |
| 3,728,590 | 4/1973 | Kim | 357/24 |
| 3,896,485 | 7/1975 | Early | 357/24 |

Primary Examiner—W. C. Tupman
Attorney, Agent, or Firm—Robert F. Cody

[57] ABSTRACT

A solid state imaging device is formed of a bulk of monocrystalline silicon which has been suitably doped. A transparent layer of $SiO_2$ overlays the bulk silicon, and atop the $SiO_2$ layer is at least one pattern of doped SiC electrodes. Successive patterns of SiC electrodes are insulated from each other by $SiO_2$. The SiC and $SiO_2$, being derivatives of silicon, passivate the bulk and serve, respectively, as transparent electrodes and transparent support for such electrodes.

2 Claims, 37 Drawing Figures

↓ HEAT + O₂

↓ SILANE

↓ PHOTORESIST

↓ EXPOSE & DEVELOP
  ELECTRODE PATTERN

↓ ETCH

↓ SILANE

↓ O₂ AT 900°-1200°C OR
  SiH₄ + O₂ AT 400°-600°C

↓ PHOTOLITHOGRAPHY

↓ ETCH; PHOTORESIST REMOVAL

↓ METHANE + DOPANT SOURCE

SILICON CHARGE-HANDLING DEVICE EMPLOYING SIC ELECTRODES

This is a division of Ser. No. 775,147, filed Mar. 7, 1977.

BACKGROUND OF THE INVENTION (1) Field of the Invention

This invention relates in general to solid state imaging devices, and in particular to such devices which employ transparent electrodes.

(2) Description Relative to the Prior Art

Solid state imaging has become a reality with the advent of silicon charge handling devices such as charge-coupled and charge-injection devices.

In a charge handling device, typically, depletion regions, or potential wells, are formed about 1 to 10 microns below surface electrodes thereof; and imaging light, entering the bulk silicon of the device, generates minority carriers in proximity to such electrodes. This precludes imaging onto the non-electrode-carrying, or back-, side of the device without first thinning the bulk silicon forming such device, such bulk being generally 200 to 400 microns in thickness before thinning.

Rather than backside-thin a silicon charge handling wafer, the trend clearly is toward the use of transparent electrodes as vehicles for allowing imaging light to generate minority carriers in charge-depleted wells. To date, several forms of transparent electrodes have been considered for silicon imaging devices: highly doped polycrystalline silicon electrodes; extremely thin gold or silver electrodes; wide bandgaps semiconductor electrodes such as electrodes of $In_2O_3$ or $SnO_2$. All such electrodes leave something to be desired for a variety of reasons: polycrystalline silicon electrodes are virtually opaque to blue light; gold and silver electrodes must be extremely thin, and of uniform thickness, a matter which leaves them fragile, hard to make and, even if perfectly made, they exhibit non-uniform absorption in the visible part of the spectrum; wide bandgap semiconductor electrodes such as doped $In_2O_3$ and $SnO_2$, although having good optical transmission properties, are unstable at high temperatures.

Typical of prior art techniques for providing a silicon imaging device having transparent electrodes is that described in U.S. Pat. No. 3,941,630, issued Mar. 2, 1976. U.S. Pat. No. 3,941,630, aside from describing the use of doped $SnO_2$ or $In_2O_3$ electrodes, describes some of the very same considerations which have given rise to the present invention.

Rather than any of the prior art transparent electrodes, the invention, as will appear below, concerns the application of silicon carbide (SiC) for electrode purposes. SiC has characteristics which are complementary to the fabrication of silicon imaging devices: SiC is intrinsically compatible with the silicon which forms the device; SiC is inert; and SiC can serve as a diffusion barrier. Several examples of prior art teachings have addressed various uses of SiC: U.S. Pat. No. 3,400,309, issued Oct. 3, 1968, discusses the epitaxial growth of monocrystalline SiC "layers", as well as the "insulating" qualities of SiC layers. U.S. Pat. No. 3,577,285, issued May 4, 1971, discusses the doping of SiC to alter its conductivity. U.S. Pat. No. 3,504,181, issued Mar. 31, 1970, although indicating the light transmissiveness of SiC, indicates the difficulty of trying to etch SiC. Indeed, Japanese Journal of Applied Physics, Volume 14, 1975, No. 11, pages 1833 and 1834, indicates that grown (monocrystalline) SiC films are (1) transparent (although appearing brownish yellow), and (2) even without doping, are of low resistivity (contrasted with the teaching of U.S. Pat. No. 3,400,309).

Having the essential qualities for imaging device electrodes, it may appear puzzling that SiC has never been employed for transparent electrode purposes. However, if one considers the following table taken from page 284 of *Heterojunctions and Metal-Semiconductor Junctions*, by A. G. Milnes and D. L. Feucht, Academic Press, 1972, Library of Congress Catalog Card No. 79-127693, one might surmise why SiC electrodes have, apparently, been ruled out for imaging device electrodes . . . "SiC electrode patterns cannot be etched conveniently". (Indeed, the etching technique of U.S. Pat. No. 3,504,181 involves "molten" $Na_2OH$ plus NaOH which, obviously, would be unattractive in the manufacture of silicon imaging devices, since it would attack both photoresist and $SiO_2$ and would also lead to sodium contamination of the device, an undesirable condition.

| | ETCHES AND THEIR EFFECTS ON SEMICONDUCTORS[a] | | | | | | | | | |
|---|---|---|---|---|---|---|---|---|---|---|
| Semi-Conductor | HCl | $H_2SO_4$ | $HNO_2$ | White-etch[b] | Methanol bromine[c] | NaOCl[d] | NaOH[e] | $H_2O_2$ | Chromic acid | Other etches |
| Ge | N | N | S | V | N | S | M | S | N | |
| Si | N | N | N | V | N | N | M[f] | N | N | |
| SiC | N | N | N | N | N | N | N | N | N | |
| GaAs | S, N | S | S, N | V | S, M | S | S | N | N | |
| GaN | N | N | N | N | N | N | S[f] | N | N | |
| GaP | N | N | N | S | S | S[g] | N | N | N | |
| GaSb | N[g] | N | V | V | M | S | N | N | S | M[h] |
| InAs | M[i] | N | M | M | M | N | N | N | S | M[j] |
| InP | V, M | N | N | N | M | N | S | N | N | |
| InSb | N[k], S[g] | N | V | V | M | N | N | N | N | M[l] |
| CdS | M | N | V | S | S | N | N | N | S | |
| CdSe | S[k, m] | N | V | V | M | N | N | N | S[m] | M[h] |
| ZnS | S | N | N | N | S | N | N | N | S[g] | |
| ZnSe | S[g] | N | M[m] | M | V | S[k], M[g] | M[g] | V | S[g] | |

| | | | | -continued | | | | | | |
|---|---|---|---|---|---|---|---|---|---|---|
| ETCHES AND THEIR EFFECTS ON SEMICONDUCTORS[a] | | | | | | | | | | |
| Semi-Conductor | HCl | $H_2SO_4$ | $HNO_2$ | White-etch[b] | Methanol bromine[c] | NaOCl[d] | NaOH[e] | $H_2O_2$ | Chromic acid | Other etches |
| ZnTe | S[i] | N | M[m] | V | M | N | V | N | S | |

[a] All solutions are at room temperature and concentrated unless otherwise noted. V = etches material vigorously; M = etches material moderately; S = etches material slightly; N = does not perceivably etch material
[b] 1 HF:4 $HNO_3$.
[c] Approximately 5% Bromine.
[d] 30% NaOCl.
[e] Approximately 20% NaOH and warm 40°-50° C. unless noted otherwise.
[f] 50% NaOH and hot 90°-100° C.
[g] Hot 90°-100° C.
[h] Etch: 1 HF:2 $HNO_3$:1 $CH_3COOH$.
[i] 20° to 100° C.
[j] Etch: 1 HF:5$HNO_3$:1 $CH_3COOH$.
[k] 20° C.
[l] Etch: 2 HF:1 $HNO_3$:1 $CH_3COOH$.
[m] Tends to form surface layer which inhibits etching.
[n] Etch: (12 $K_2Cr_2O_7$ sat. sol.: 4 $H_2SO_4$) + (3 HCl) at room temp. Rinse: 1 $Na_2S_2O_4$: 1 NaOH: 3 $H_2O$ at 85° C.

SUMMARY OF THE INVENTION

The present invention provides a charge handling imaging device having patterns of transparent SiC electrodes: In providing such a device, the invention . . . rather than attempt to employ the practice of removing, by etching or otherwise, unmasked SiC in a film thereof, thereby to pattern electrodes out of the SiC film . . . teaches that patterns of SiC electrodes can be formed by first patterning silicon, and then converting the patterned silicon to SiC. Silicon patterns can be formed by either of two general techniques, both employing relatively conventional mask-and-etch procedures, and both such techniques are described in detail below. In its presently preferred form, the imaging surface of a charge handling device according to the invention is covered by patterns of transparent electrodes which are insulated from each other by transparent nonconductors, and both electrodes and nonconductors cooperate to passivate the surface of the device.

(SiC as identified herein is of the thin film type. Hot pressed SiC, being opaque, forms no part of the invention.)

The invention is described in further detail below in relation to the FIGURES, of which:

Figure 3:
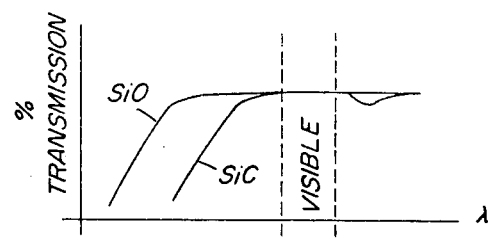
Figure 4A:
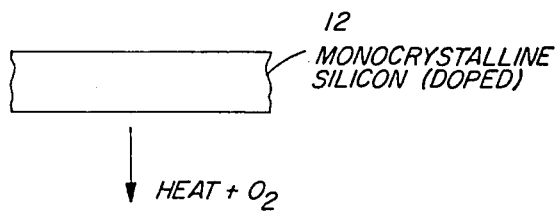
Figure 4B:
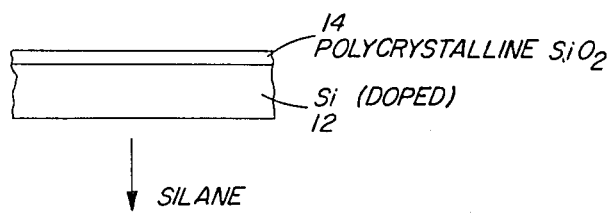
Figure 4C:
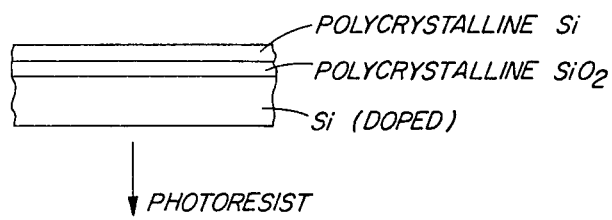
Figure 4D:
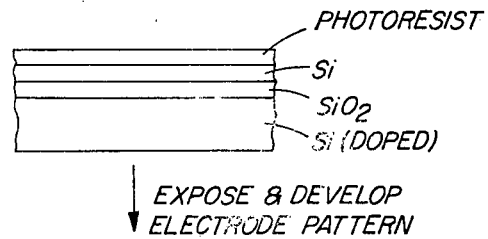
Figure 4E:
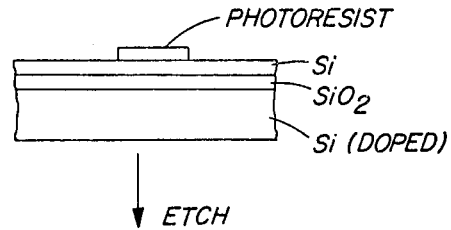
Figure 4F:
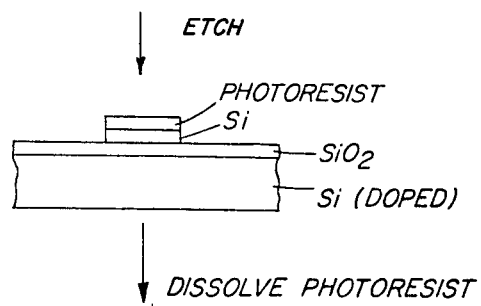
Figure 4G:
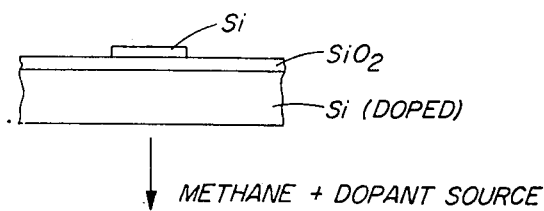
Figure 4H:
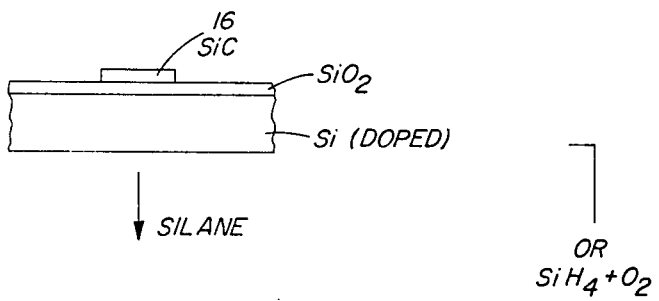
Figure 4I:
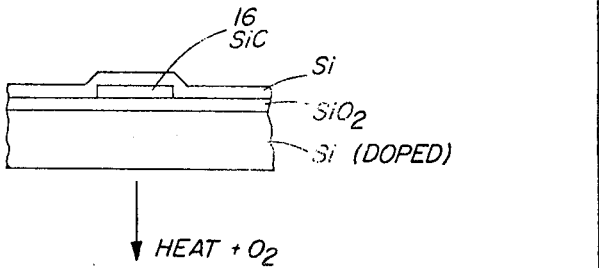
Figure 4J:
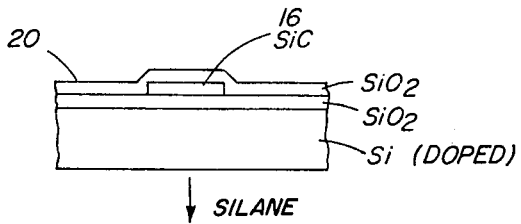
Figure 4K:
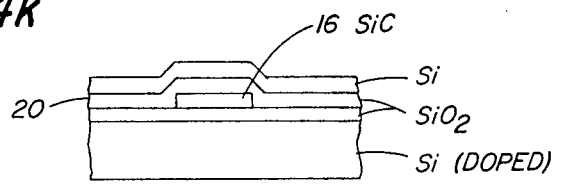
Figure 4L:
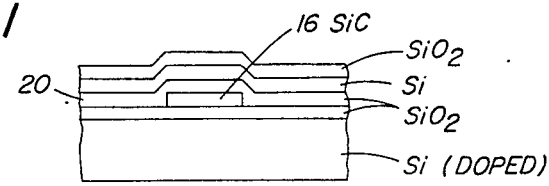
Figure 4M:
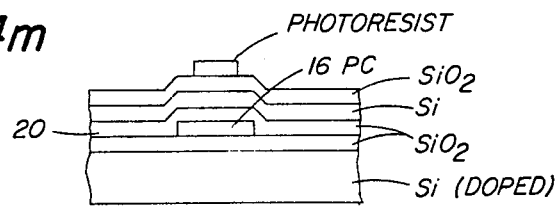
Figure 4M:
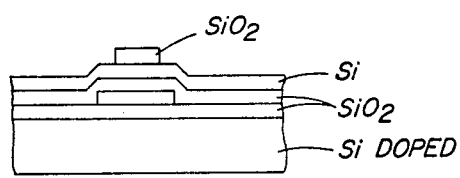
Figure 4N:
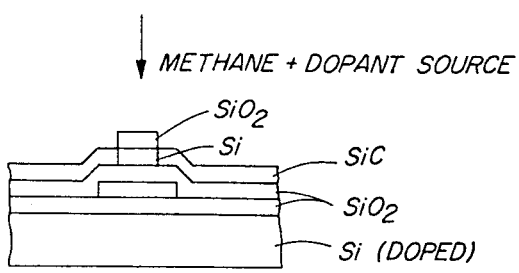
Figure 4O:
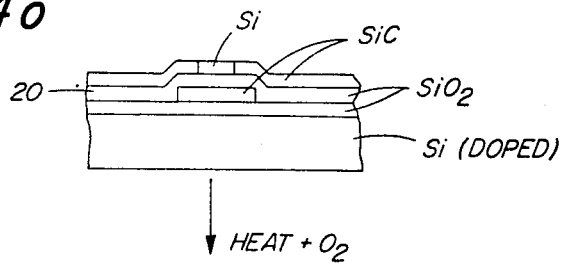
Figure 4P:
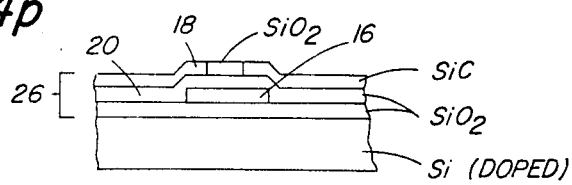
Figure 5A:
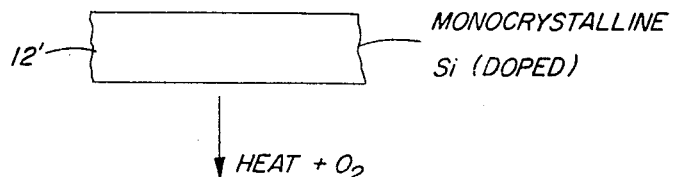
Figure 5B:
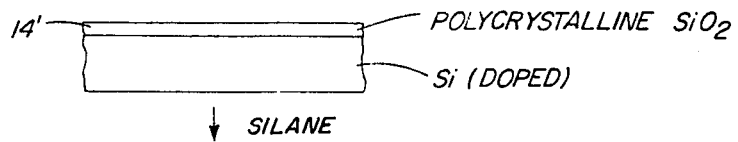
Figure 5C:
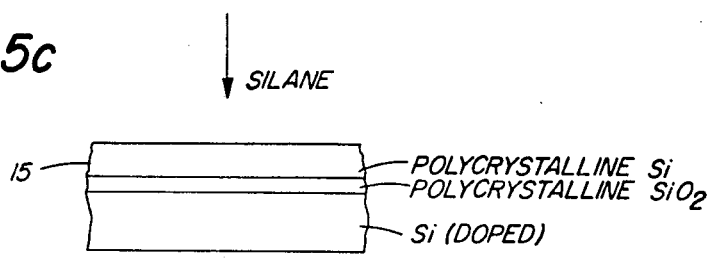
Figure 5D:
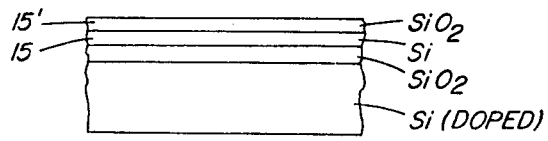
Figure 5E:
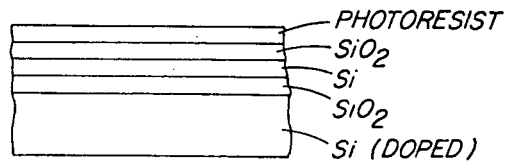
Figure 5F:
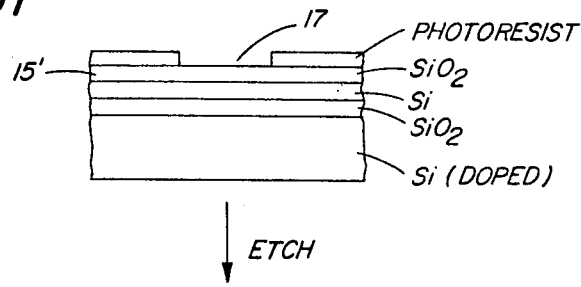
Figure 5G:
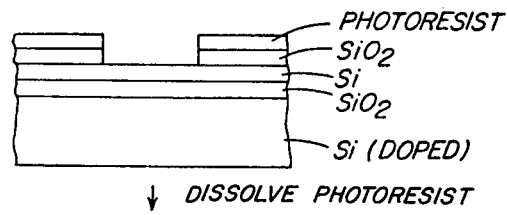
Figure 5I:
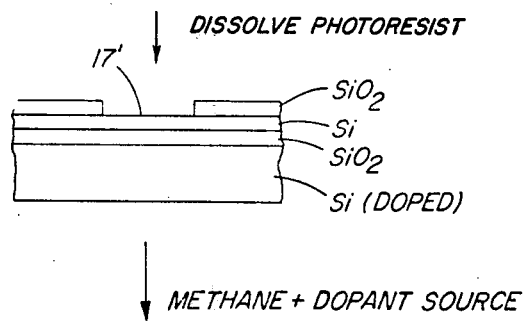
Figure 5J:
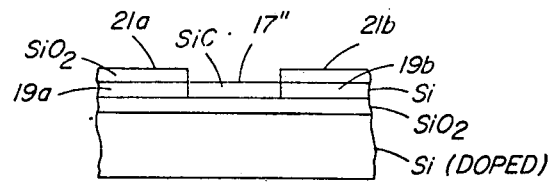
Figure 5K:
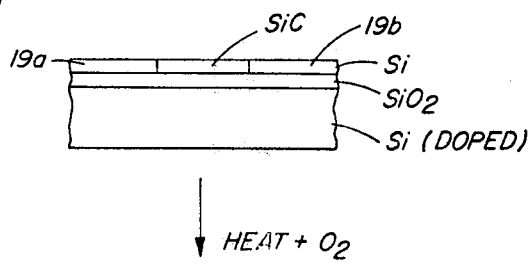
Figure 5L:
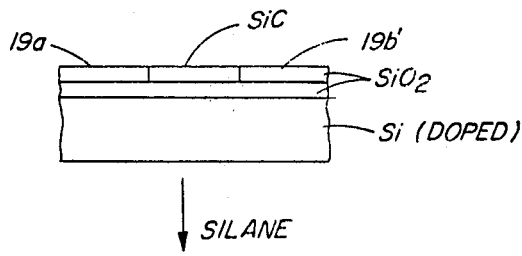
Figure 5L:
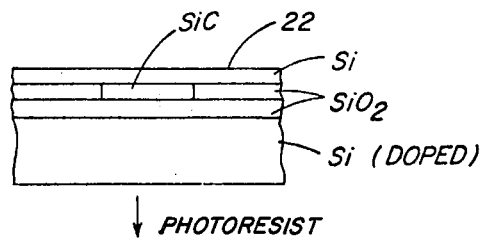
Figure 5M:
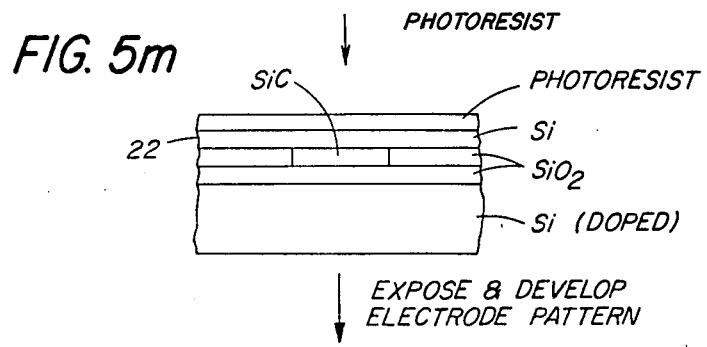
Figure 5N:
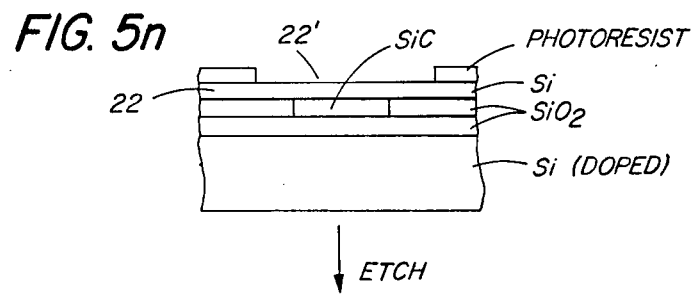
Figure 5O:
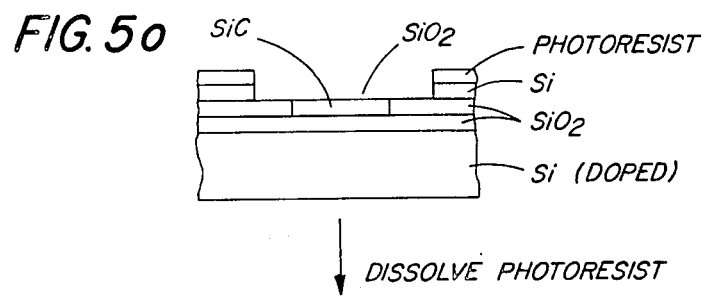
Figure 5P:
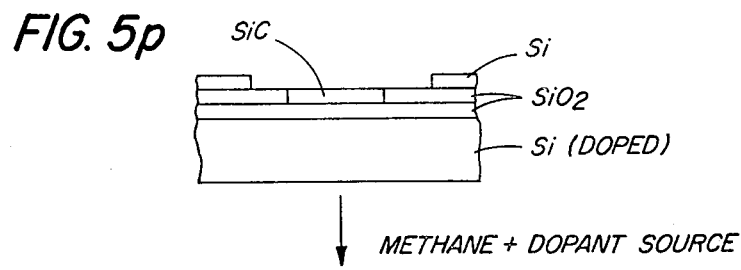
Figure 5Q:
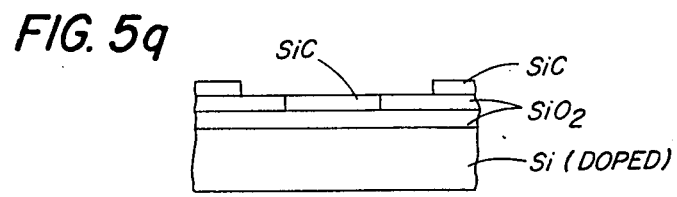

FIG. 3 indicates diagrams representing the optical transmission qualities of $SiO_2$ and SiC;

FIG. 4, a through p, illustrates the fabrication of electrodes according to one embodiment of the invention; and FIG. 5, a through q, illustrates the fabrication of electrodes according to another embodiment of the invention.

Figure 1:
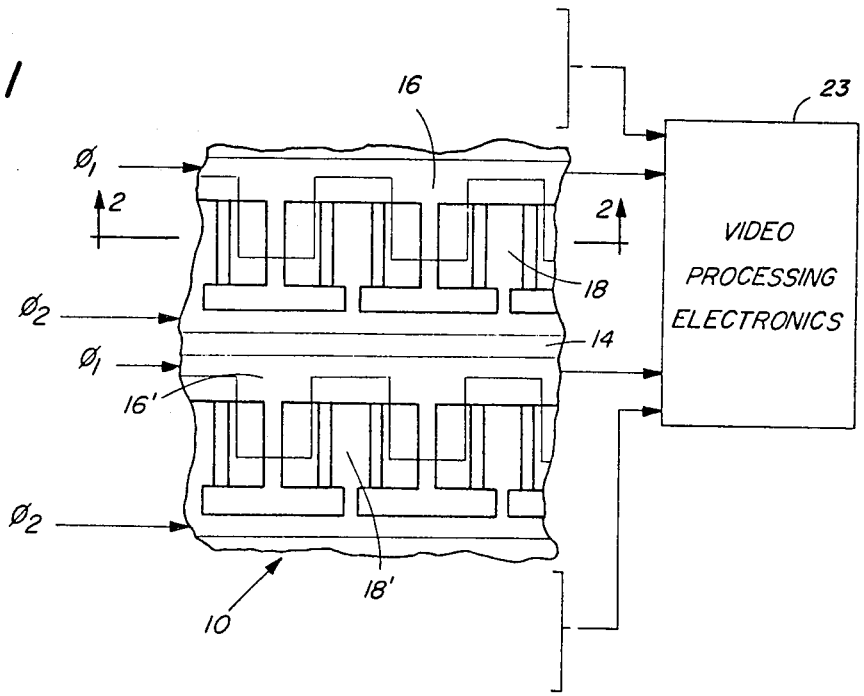
FIG. 1 is a plan view of part of a two-phase charge-coupled device employing the invention.
Figure 2:
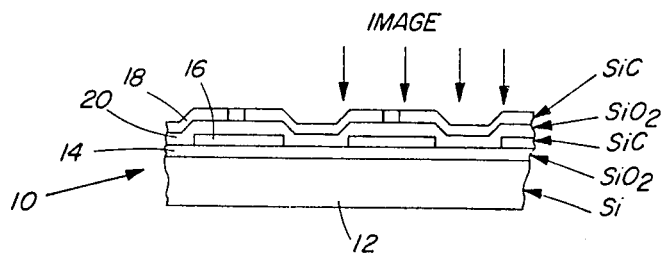
FIG. 2 is a side sectional view of the device of FIG. 1.

Reference should now be had to FIGS. 1 and 2: Part of a two-phase charge-coupled device 10 is comprised of a bulk of monocrystalline silicon 12 of a suitably doped type. An insulating layer 14 of $SiO_2$ is formed on the bulk silicon 12; and first and second electrodes 16, 18 of polycrystalline SiC overlay the $SiO_2$ insulating layer 14, thereby providing an MOS structure. A layer of $SiO_2$ 20 insulates the electrodes 16, 18 from each other, such electrodes being preferably less than 5 microns in thickness, and having a resistivity less than 0.1 ohm centimeter.

Since the electrodes 16, 18 and insulators 14, 20 are all transparent to visible light (see FIG. 3), visible image light may enter the bulk silicon 12 and form therein minority carriers corresponding to such imaging light. Voltage phases $\phi_1$, $\phi_2$, being applied to the electrodes 16, 18, respectively, process video signal information to electronics 22 for further signal processing according to techniques known in the art.

The devices of FIGS. 1 and 2—new to the solid state imaging art—is characterized by an arrangement of transparent electrodes and transparent insulators, all of which cooperate to provide diffusion barriers to impurities which may otherwise contaminate the bulk silicon 12; and all of which are inert and, by being formed of silicon derivatives, are intrinsically compatible with the bulk silicon.

Since it is virtually impossible to etch SiC into patterns of electrodes, the device of FIGS. 1 and 2 may be provided by the teaching of FIG. 4 (a through p). Starting (FIG. 4a) with a wafer of suitably doped monocrystalline silicon (12), the wafer is heated (FIG. 4b) to about 1000° C. in an oxygen atmosphere, thereby providing a transparent insulating layer (14) of polycrystalline $SiO_2$. The wafer is then heated (FIG. 4c) in a silane ($SiH_4$) atmosphere, say to 500° to 900° C., causing a polycrystalline layer of silicon, preferably less than 5 microns in thickness, to grow atop the insulating layer (14). According to this—the "positive"—technique for producing SiC electrode patterns, a photoresist of a suitable type is applied (FIG. 4d) over the silicon layer, and then so exposed, and developed, that silicon, corresponding to the desired electrode pattern, is shielded by the developed photoresist (FIG. 4e). The unshielded silicon is then (FIG. 4f) etched away—say by chemical or plasma etching—after which the developed patterned photoresist is dissolved away (FIG. 4g). By exposing the pattern of silicon to a heated (typically 1100°) atmosphere of methane ($CH_4$) and a dopant source, say nitrogen and/or phosphine gases, the silicon pattern converts (FIG. 4h) to an "electrode" pattern (16) of transparent polycrystalline SiC, the SiC being of an N-type. (Were it is desired to produce SiC electrodes of a P-type, typically, aluminum or boron would serve as the dopant source.)

Although methane is presently preferred as a source of carbon for converting silicon to SiC, other hydrocarbons such as propane and acetylene may be used in the practice of the invention.

To provide the electrodes 18, the procedures of FIG. 4, a through h, are in a sense repeated: Silicon is grown over the structure of FIG. 4h by exposure to silane gas (FIG. 4i), the grown silicon being converted to an insulating layer (20)—for insulating the electrodes 16, 18 from each other—of transparent SiO$_2$ by heating (FIG. 4j) the structure in an atmosphere of oxygen. Alternatively, an SiO$_2$ film may be deposited by the oxidation of silane. Silicon, for forming the second set of electrodes (18) is then grown on the insulating layer of SiO$_2$ in a silane atmosphere (FIG. 4k), after which patterning of the silicon layer into SiC electrodes (18) is achieved. Patterning the electrodes 18 is by a "negative" technique. After depositing a layer of SiO$_2$ by the oxidation of silane (FIG. 4l), photoresist is applied and exposed and developed to reveal, not shield, the electrode (18) pattern (FIG. 4m). After etching the SiO$_2$ and removing the photoresist (FIG. 4m'), a methane-plus-dopant treatment (FIG. 4n) is used to produce SiC electrode (18). The SiO$_2$ is then dissolved away to reveal shielded silicon between the electrodes (18). Since the silicon between the electrodes (18) is opaque (and would thus prevent light from passing through to the electrodes 16), the device of FIG. 4 is again heated in an oxygen atmosphere to convert such silicon to transparent SiO$_2$.

What results from the practice of FIG. 4 is a silicon imaging device, the imaging or front face of which is provided with a passivation cover 26, the very parts of which are electrodes, and insulators between such electrodes, and between such electrodes and the silicon, such electrodes, and insulators, all being transparent derivatives of the very same material (silicon) forming the device itself.

While still employing the patterning of silicon to provide SiC electrodes, the technique of FIG. 5 offers an alternative to the procedures described in connection with FIG. 4. Starting (FIG. 5a) with a wafer of monocrystalline silicon 12', a transparent insulating layer (14') of polycrystalline SiO$_2$ is grown (FIG. 5b) on the wafer, by heating the wafer in an oxygen atmosphere. A relatively thick layer 15 of silicon is then grown (FIG. 5c) atop the layer 14' by silane treatment. Heat-plus-oxygen (FIG. 5d) causes a crust 15' of SiO$_2$ to form on the silicon; and, then, a coating of photoresist (FIG. 5e) is applied over the SiO$_2$ crust 15'. By suitably exposing and developing (FIG. 5f) the photoresist, an unshielded pattern 17 of SiO$_2$ is produced in the SiO$_2$ crust 15'. After the SiO$_2$ pattern 17 is etched away (FIG. 5g), the photoresist shield is dissolved (FIG. 5h), leaving a pattern of SiO$_2$ shielding the non-electrode part of the silicon layer. Hydrocarbon treatment (methane), with a suitable dopant, converts (FIG. 5h) the unshielded part 17' of the silicon layer to an SiC electrode 17".

Since the shielded silicon (19a, b) is opaque, the SiO$_2$ shields (21a, b) are etched away (FIG. 5j), the device being then heated in oxygen to covert (FIG. 5k) the silicon (19a, b) to transparent SiO$_2$ (19a', b').

By means of silane treatment (FIG. 5l) a silicon layer 22 is again grown atop the wafer. A second electrode pattern is then exposed and developed in photoresist (FIG. 5n, m) coated on the silicon layer 22, after which (FIG. 5o) the unshielded silicon 22' is etched away. Then, the photoresist shield for the second electrode pattern is dissolved (FIG. 5p), after which the exposed silicon pattern is exposed (FIG. 5q) to a hydrocarbon-and-dopant source, as discussed above, to convert the silicon to an electrode pattern of SiC. As in the case of device fabrication per FIG. 4, note should be taken per FIG. 5 that the whole device surface is passivated by either, or both, transparent SiO$_2$ insulators, or SiC electrodes, having all of the qualities referred to above.

The invention has been described in detail with particular reference to preferred embodiments thereof, but it will be understood that variations and modifications can be effected within the spirit and scope of the invention. For example, while the invention has been depicted in connection with two-phase charge-coupled devices, the invention may be employed in connection with any charge-coupled device, regardless of the number of phases employed for clocking purposes, or with charge-injection devices. Also, while not so indicated, it would be within the scope of the invention to form a first set of electrodes according to the technique of either FIG. 4 or FIG. 5, and to form a second set of electrodes in accordance with the technique of the other figure.

What is claimed is:

1. A method for use in fabricating a solid state imaging device comprising the steps of:
   (a) heating a doped monocrystalline silicon wafer in an oxygen atmosphere to form an oxidic crust of silicon on the surface of said wafer;
   (b) growing a first layer of polycrystalline silicon on said oxidic crust, said layer being less than 5 microns in thickness;
   (c) selectively exposing part of said first silicon layer to a hydrocarbon and dopant source, thereby to convert said silicon layer part to a first pattern of transparent silicon carbide electrodes;
   (d) growing a second polycrystalline silicon layer over said electrodes;
   (e) heating said second silicon layer in an atmosphere of oxygen to oxidize said silicon layer;
   (f) growing a third layer of polycrystalline silicon on said oxidized second silicon layer, said third silicon layer being less than 5 microns in thickness; and
   (g) selectively exposing part of said third silicon layer to a hydrocarbon and dopant source, thereby to convert such silicon layer part to a second pattern of silicon carbide electrodes which are cooperable with said first pattern of electrodes.

2. The method of claim 1 wherein said exposure of parts of said first and third layers of silicon to a hydrocarbon source is by means of methane at less than 1100° C.

* * * * *

UNITED STATES PATENT AND TRADEMARK OFFICE
CERTIFICATE OF CORRECTION

PATENT NO. : 4,189,826
DATED : February 26, 1980
INVENTOR(S) : Frank T. J. Smith It is certified that error appears in the above-identified patent and that said Letters Patent are hereby corrected as shown below:

Column 1, line 33, "bandgaps" should read ---bandgap---.

Column 4, line 24, "devices" should read ---device---;
line 57, after "it" delete "is".

Column 5, line 14, "electrode" should read ---electrodes---.

Signed and Sealed this

Third Day of June 1980

[SEAL]

Attest:

SIDNEY A. DIAMOND

Attesting Officer   Commissioner of Patents and Trademarks